United States Patent [19]

Kempf

[11] Patent Number: 4,716,093

[45] Date of Patent: Dec. 29, 1987

[54] SOLVENT DEVELOPABLE PHOTORESIST COMPOSITION AND PROCESS OF USE

[75] Inventor: Richard J. Kempf, Towanda, Pa.

[73] Assignee: E. I. Du Pont de Nemours and Company, Wilmington, Del.

[21] Appl. No.: 839,973

[22] Filed: Mar. 17, 1986

[51] Int. Cl.$^4$ .................... G03C 1/495; G03C 1/68
[52] U.S. Cl. ................... 430/277; 430/263; 430/260; 430/910; 430/281; 522/116; 522/117; 522/121
[58] Field of Search ............ 430/263, 260, 910, 281, 430/277; 522/116, 117, 121

[56] References Cited

U.S. PATENT DOCUMENTS

| | | | |
|---|---|---|---|
| 3,469,982 | 9/1969 | Celeste | 96/35.1 |
| 3,989,610 | 11/1976 | Tsukada et al. | 204/159.15 |
| 4,289,841 | 9/1981 | Cohen et al. | 430/253 |
| 4,339,474 | 7/1982 | Kishida et al. | 522/121 X |
| 4,349,620 | 9/1982 | Cyr et al. | 430/259 |
| 4,469,777 | 9/1984 | O'Neil | 430/315 |
| 4,510,593 | 4/1985 | Daniels | 522/121 X |

*Primary Examiner*—John E. Kittle
*Assistant Examiner*—Cynthia Hamilton

[57] ABSTRACT

Solvent developable composition useful as photoresist contains binder formed from methylmethacrylate and a $C_2$ to $C_4$ alkyl methacrylate whereby improved development and/or stripping is obtained.

14 Claims, No Drawings

SOLVENT DEVELOPABLE PHOTORESIST COMPOSITION AND PROCESS OF USE

BACKGROUND OF THE INVENTION

This invention relates to an improved solvent developable photopolymerizable composition and its use in a preferred process as a photoresist in making printed circuit boards.

Photosensitive compositions particularly useful as photoresists in making printed circuit boards are well known in the prior art with these compositions conventionally stored in roll form. Illustratively a three ply material is disclosed in U.S. Pat. No. 3,469,982 with the photosensitive composition sandwiched between a support film and a cover sheet. The photosensitive composition contains components of monomer, initiator and a polymeric binder which allows such composition to be negative working (i.e., exposure to actinic radiation hardens the film to make the exposed portion insoluble in a developer). The three ply material is unwound from a roll with the cover sheet removed from contact with the photosensitive composition prior to use in lamination to a substrate, e.g., a copper surface. The laminated composition is imagewise exposed to actinic radiation with a support film stripped from the photosensitive composition before or after the exposure step. The unexposed areas of the starting light-sensitive layer are washed away in a development step to form a resist image of polymeric material. For a solvent developable film a conventional solvent employed is methyl chloroform also known as 1,1,1-trichloroethane. Such a solvent will remove portions of the photosensitive layer which have not been exposed to actinic radiation but will not adversely affect exposed portions. The areas of the substrate surface which are not protected by the remaining areas of laminated material are permanently modified by etching or by plating. Thereafter the photoresist is removed in a stripping process. A conventional stripping solvent for a solvent developable composition is a solution of methylene chloride and methanol.

The present invention allows improved results in development and/or strippability of a negative acting solvent developable film through formulation of the photosensitive composition.

SUMMARY OF THE INVENTION

The present invention is directed to a solvent developable photopolymerizable composition comprising
  (a) at least one nongaseous ethylenically unsaturated compound having a boiling point above 100° C. at normal atmospheric pressure and being capable of forming a high polymer by photoinitiated addition polymerization.
  (b) an initiating system activated by actinic radiation, and
  (c) a preformed macromolecular binder soluble in methyl chloroform at a temperature of 22° C. and a time not greater than 24 hours, said binder formed from monomers comprising methylmethacrylate and $C_2$ to $C_4$ alkyl methacrylate. wherein said composition as a film of 0.002 inch thickness laminated to a copper substrate and imagewise exposed to actinic radiation will meet at least one of the following conditions:
  (i) a time to clean of not greater than 26 seconds when the imagewise exposed film is passed at a transport speed of 4.5 feet per minute through a spray of methyl chloroform at a temperature of 65° C. and a spray pressure of 20 psi (gauge) whereby all unexposed composition is removed from the substrate or
  (ii) a time to strip of the exposed composition of not greater than 9.5 seconds when the exposed composition is passed at a transport speed of 10 feet per minute through a spray of a solution containing by weight 93 parts methylene chloride to 6 parts methanol at a temperature of 65° C. and a spray pressure of 21 psi (gauge) whereby all exposed composition is removed from the substrate.

DETAILED DESCRIPTION OF THE INVENTION

The photopolymerizable compositions of the present invention are solvent developable. The composition ordinarily present as a film on a flexible backing film is laminated to a substrate which is preferably copper present on an insulating layer. The composition is imagewise exposed to actinic radiation and the exposed portions of the composition become photopolymerized or photohardened. With solvent developable films in commercial use, various organic solvents can be employed to remove, i.e., develop, unexposed portions of the photopolymerizable film without substantially affecting the exposed photopolymerized portions of the laminated layer. The solvent which is considered to be the most widely employed industrially is methyl chloroform. In the present context "solvent developable" means a photo polymerizable composition will be dissolved by a spray of methyl chloroform, but photopolymerized areas resulting from actinic exposure of the composition will be substantially unaffected.

The extent to which a photopolymerizable resist composition is developable is typically determined as the "time to clean" (TTC) in a conventional processor and is translated into a development rate (DR) or throughput for that processor. For the purposes of this invention development time is identified with "time to clean" and development rate is identified as throughput where the development time and rate are determined for the following conditions: A 0.002 inch thick photoresist film laminated to the copper surface of a cleaned printed circuit substrate is passed through a processor, particularly a Riston ® C processor, containing methyl chloroform as the development solvent at 65° F. with 20 psi (gauge) spray pressure and a transport rate through the processor of 4.5 ft/min.

A Riston ® C processor has a 72 inch trans-port path through three development chambers and one rinse chamber. The path in the first development chamber is 37.5 inches and in each subsequent development chamber and rinse chamber is 11.5 inches. Fourteen staggered spray manifolds having an array of 6 and 5 spray nozzles with the first manifold having nozzles cone pattern (Steiner No. SSM81SQ) and the remaining nozzles of flat fan pattern (H ⅛ Vv 8804 nozzle from Spraying System Co.) are situated transversely to the transport path starting at 3⅜ inches into the processor and having the following sequence in inches between spray bar centers: 4:5:4:5:4:5:4:7:4:7:4:8:4 along the path. Eight manifolds are in the first development chamber. Methyl chloroform is sprayed in the development chambers and water is sprayed in the rinse chamber.

The "time to clean" (TTC) is visually determined as the time needed for all unexposed resist to be removed from the laminated element as it passes through the processor. The point into the processor at which the resist visually appears to be completely removed is identified as the composition's "break point". (A more precise method for describing TTC is described hereinafter.) In the conventional use of automatic processors the transport rate is adjusted so that the "break point" for a particular composition occurs about ⅓ of the way into the processor so as to insure that all unexposed resist residue is removed from the copper surface (i.e., at the 6th manifold in the Riston ® C processor). For the purpose of this invention the TTC for a 0.002 inch thick photoresist film is used to calculate the transport rate so that the "break point" is 26 inches into the development path. This transport rate is identified as the "throughput" or "development rate" (DR) for that particular film composition.

These photopolymerizable compositions conventionally contain polymerizable ethylenically unsaturated compound, typically a monomer such as a nongaseous ethylenically unsaturated monomer containing at least one terminal ethylenic group, having a boiling point above 100° C. at normal atmospheric pressure and being capable of forming a high polymer by photoinitiated addition polymerization, an initiating system activated by actinic radiation which initiates photopolymerization, and binder. It is understood that in the present context photopolymerized is inclusive of photohardening where crosslinking takes place to cause insolubilization of portions of the composition exposed to actinic radiation. The components will conventionally be present in a range by weight of from 10 to 40 parts ethylenically unsaturated compound, and 40 to 70 parts binder. Preferred ranges for the compound are 28 to 36 parts and for the binder are 50 to 60 parts.

Enhanced properties are imparted to the composition by the selection of binder in the present invention. The binder is a polymer formed from methylmethacrylate and $C_2$–$C_4$ alkyl methacrylate. Therefore, the binder is formed from methylmethacrylate and one or more of ethyl methacrylate, propyl methacrylate isobutyl methacrylate and n-butyl methacrylate. A preferred example of the binder is formed from methylmethacrylate and ethyl methacrylate. The monomer ratio of the binder components must be chosen such that the binder is soluble in methyl chloroform since the polymer must have the property of being soluble in such solvent. This means that the polymer binder will dissolve with the substantial absence of particles when the polymer is stirred in methyl chloroform at a temperature of 22° C. for 24 hours. Preferably the binder will dissolve within 20 hours. All ratios of the disclosed monomers in the copolymer will not give the necessary solubility. A further monomer component can be employed in formation of the polymeric binder provided the essential properties as stated herein are realized.

In use of methylmethacrylate and ethyl methacrylate in the copolymer a weight ratio will be in the range from 90:10 to 50:50 and more preferably 85:15 to 60:40.

It has been discovered that faster development rates and shorter development times are obtainable with compositions of the present invention compared to typical development times and rates of commercial solvent developable films. Illustratively for films of nominal thickness of 0.002 inch development times (TTC) of 25.9 to 18.5 seconds with commensurate development rates of 5 to 7 ft/min. have been obtained with use of the defined binder compared to 35.4 to 33 seconds and 3.7 to 3.9 ft/min. in the case of Riston ® 1020 and Laminar ® GSI resist films respectively. These two films are widely sold commercial solvent developable films. Additionally, formulations containing the defined binder have resulted in no loss of latitude with the shorter development time. Development latitude is the ability to overdevelop the exposed photoresist without adversely affecting the functional properties of the photoresist. For the compositions of this invention an overdevelopment latitude of 2X or more is possible, i.e., a printed circuit panel could be run through a processor twice without a substantial adverse effect.

The decrease in development time or increase in development rate is important in utilization of existing equipment to increase throughput, e.g., increase the number of circuit boards which can be produced without the need and expense for additional equipment.

Without being bound to any theory, it is considered that improved results have been obtained due to the solubility characteristics of the binder. Illustratively conventional binders in commercial solvent developable formulations are not soluble in developer solvent namely methyl chloroform. The introduction of monomer into the photopolymerizable composition serves to plasticize the binder to obtain the necessary solubility characteristics to allow unexposed portions of the photopolymerizable compositions to be removed by developer.

In addition to an improvement in development rate, faster stripping rates from a substrate have been observed in removal of the photopolymerized composition. Stripping means removal of the photopolymerized composition from a substrate. In commercial use a typical stripping solution is methylene chloride/methanol.

The extent to which a photopolymerized resist is strippable from a processed printed circuit board is typically determined as the "time to strip" (TTS) in a conventional processor and is translated into a stripping rate (SR) or throughput for the processor. For the purpose of this invention stripping time is identified with "time to strip" and stripping rate is identified as throughput where the stripping time and rate are determined for the following conditions. A 0.002 inch thick photoresist film laminated to a printed circuit substrate and processed to give a developed photopolymerized image on the copper surface of the substrate. The uncovered copper surface is either etched or plated and then the resist clad printed circuit substrate is passed through a processor, such as a Riston ® C2 processor similar to the Riston ® C processor described earlier except flat fan pattern nozzles (H ⅛ VV 8004 nozzle from Spraying System Co.) are on the first manifold and the nozzles on the remaining manifolds are of cone pattern (Steiner No. SSM815Q). containing 93 parts by weight methylene chloride and 6 parts by weight methanol. e.g., SC-900 Photoresist Stripper (sold by SAL Chemical Co., which contains by weight 93% methylene chloride, 6% methanol and 1% stabilizer) at a temperature about 65° F., with a 21 psi (gauge) spray pressure and a transport rate through the processor of 10 ft/min. The "time to strip" is visually determined as the time needed for all exposed resist to be removed from the processed circuit board as it passes through the processor. The point into the processor at which the resist is completely removed is identified as the resist's "break point". In the conventional use the transport rate is adjusted so that the "break point" for a particular resist occurs about ¼ of the way into the processor. For the purpose of this invention the TTS for a 0.002 inch thick photoresist image is used to calculate the transport rate so that the "break point" is 17 inches into the 72 inch stripper processor path. This new transport rate is identified as the stripping rate (SR) for that particular film composition. Stripping times (TTS) of the order of 9.4 to 5.6 seconds with a commensurate stripping rate (SR) of 9 to 15 ft/min. have been obtained compared to 14 to 10 seconds and 6.1 to 8.5 ft/min. for commercial solvent developable films of Riston ® 1020 and Laminar ® GSI resists respectively. Thus faster throughput of substrates have been obtained in development and stripping. The decrease in time necessary for development and strippability is considered significant in obtaining increased throughput. Additional equipment with new capital investment may not be necessary to obtain a desired increased throughput.

In the present invention the disclosed binder will preferably comprise all or substantially all of the binder component. However it is within the scope of the present invention that one or more additional binders can be employed provided they do not significantly affect in an adverse manner either the developability or the stripping rate benefits realized by the present invention. Accordingly the 0.002 inch thick photopolymerizable resist composition will have a minimum developability rate of not less than 5 ft/min. (i.e., TTC of not more than 26 seconds) and/or a minimum strippability rate of not less than 9 ft/min. (i.e., TTS not more than 9.5 seconds).

The photopolymerizable compositions of the present invention are storage stable, i.e., the composition can be stored for a prolonged period of time such as in the form of a would roll. Conventionally the composition is sandwiched between a support film and a cover film. The property of storage stability can be measured in a short term test since a true storage stability test can take a considerable period of time, i.e., the order of months or even a year. The correlation of storage stability and particularly lack of substantial cold flow of the photosensitive composition causing edge fusion with a short term test can be measured herein by creep viscosity test. In general a storage stable aqueous processable composition will have a creep viscosity of at least 20 megapoise, preferably at least 40 megapoise. However, for conventional solvent processable photoresist films a creep viscosity of at least about 80 megapoise is typically used to insure storage stability. Another test for storage stability is to store the composition in roll form for six (6) months at 25° C. or for one (1) month at 40° C.. Absence or substantial absence of edge fusion indicates storage stability of the composition.

Among the factors affecting storage stability are the nature of the polymeric binder and the monomer to binder ratio. For a given monomer/binder ratio. compositions having binders which are too soft, i.e., have too low of a glass transition temperature (Tg) will be susceptible to cold flow and edge fusion. Likewise for a given binder of acceptable glass transition temperature, compositions having too high of a monomer content will be susceptible to cold flow and edge fusion. On the other hand, if glass transition temperature of the binder is too high, i.e., the polymer is too hard or brittle, and/or if the monomer level is too low, the minimum functional characteristics of the composition such as adhesion to copper and processability through etching or plating may be inadequate to make a useful resist. As is well known in the art, glass transition temperatures can be either measured directly or can be calculated from the component parts of a given copolymer or interpolymer. For the copolymers of methylmethacrylate and alkyl methacrylates of this invention, the copolymer glass transition temperature is typically maintained in a range from about 75° C. to about 101° C. to obtain acceptable storage stability and resist characteristics. With such copolymers, monomer content can be varied between 10 to 40% of the composition and more preferably between 28 to 36% of the composition.

As previously discussed the present composition is formed from one or more monomers and an initiating system activated by actinic radiation. Suitable monomers which can be used as the sole monomer or in combination with others such as those in conventional solvent developable photoresist include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No. 3,380,831, 2,2-di(p-hydroxyphenyl)-propane diacrylate, pentaerythritol tetraacrylate, 2,2-di(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl) ether of bisphenol-A, di-(2-methacryloxyethyl) ether of bisphenol-A, di-(3-acryloxy-2-hydroxypropyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di-(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyl-trimethylol propane triacrylate, ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the composition can also contain one or more free radical-initiated, chain-propagating, addition-polymerizable, ethylenically unsaturated compounds generally having a molecular weight of at least about 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, e.g., those having a plurality of addition polymerizable ethylenic linkages particularly when present as terminal linkages. Especially preferred are those wherein at least one and preferably most of such linkages are conjugated with a double bonded carbon, including carbon double bonded to carbon and to such heteroatoms as nitrogen, oxygen and sulfur. Outstanding are such materials wherein the ethylenically unsaturated groups, especially the vinylidene groups, are conjugated with ester or amide structures.

Preferred free radical-generating addition polymerization initiators activatable by actinic light and thermally inactive at and below 185° C. include the substituted or unsubstituted polynuclear quinones which are compounds having two intracyclic carbon atoms in a conjugated carbocyclic ring system, e.g., 9,10-anthraquinone, 1-chloroanthraquinone, 2-chloroanthraquinone, 2-methylanthraquinone, 2-ethylanthraquinone, 2-tert-butylanthraquinone, octamethylanthraquinone, 1,4-naphthoquinone, 9,10-phenanthrenequinone, 1,2-benzanthraquinone, 2,3-dichloronaphthoquinone, 1,4-dimethylanthraquinone, 2,3-dimethylanthraquinone, 2-phenylanthraquinone. 2-3-diphenylanthraquinone. sodium salt of anthraquinone alpha-sulfonic acid, 3-chloro-2-methylanthraquinone, 7,8,9,10-tetrahydronaphthacenequinone, and 1,2,3,4-tetrahydrobenz (a) anthracene-7, 12-dione. Other photoinitiators which are also useful, even though some may be thermally active at temperatures as low as 85° C., are described in U.S. Pat. No. 2,760,863 and include vicinal ketaldonyl alcohols, such as benzoin, pivaloin, acyloin ethers, e.g., benzoin methyl and ethyl ethers; α-hydrocarbon-substituted aromatic acyloins, including α-methylbenzoin, α-allyl-benzoin and α-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine. oxazine, and quinone classes: Michler's ketone, benzophenone, 2,4,5-triphenylimidazolyl dimers with hydrogen donors, and mixtures thereof as described in U.S. Pat. Nos. 3,427,161; 3,479,185; and 3,549,367 can be used as initiators. Similarly the cyclohexadienone compounds of U.S. Pat. No. 4,341,860 are useful as initiators. Also useful with photoinitiators and photoinhibitors are sensitizers disclosed in U.S. Pat. No. 4,162,162.

Suitable binders which are polymeric when employed with one or more named binders of the class previously described can include the following: polyacrylate and alpha-alkyl polyacrylate esters, e.g., polymethyl methacrylate and polyethyl methacrylate: polyvinyl esters, e. g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids, (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate; cellulose ethers, e.g., methyl cellulose, ethyl cellulose and benzyl cellulose; polycarbonates; polyvinyl acetal, e.g., polyvinyl butyral, polyvinyl formal; polyformaldehydes.

Thermal polymerization inhibitors that can be used in the photosensitive compositions are: p-methoxy-phenol, hydroquinone, and alkyl and aryl-substituted hydroquinones and quinones, tert-butyl catechol, pyrogallol, copper resinate. naphthylamines, beta-naphthol, cuprous chloride, 2,6-di-tert-butyl-p-cregol, phenothiazine, pyridine, nitrobenzene and dinitrobenzene, p-toluquinone and chloranil. Also useful for thermal polymerization inhibitors are the nitroso compositions disclosed in U.S. Pat. No. 4,168,982. Normally a thermal polymerization inhibitor will be present to increase stability in storage of the photosensitive compositions.

Various dyes and pigments may be added to increase the visibility of the resist image. Any colorant, however, should preferably be transparent to the actinic radiation used.

The solvent developable composition in its preferred use as a photoresist is sandwiched as a solid film between a support film and a cover sheet. The resulting element preferably would be stored in a would roll with the cover sheet removed prior to lamination to a substrate such as a copper surface. Following imagewise exposure to actinic radiation and development, the exposed surface of the substrate can be etched or plated in conventional manner prior to stripping of the exposed composition.

A suitable support preferably having a high degree of dimensional stability to temperature changes may be chosen from a wide variety of films composed of high polymers, e.g., polyamides, polyolefins, polyesters, vinyl polymers, and cellulose esters. A preferred support is polyethylene terephthalate. Also generally a cover sheet is present on the appropriate surface of the solvent developable composition. The protective cover sheet is removed prior to lamination. The cover sheet may be chosen from the same group of polymer films listed as supports, polyethylene being particularly useful. The cover sheet releases from the three ply element more readily than the support.

The following examples more fully illustrate the present invention. All parts and percentage are by weight and degrees are in centigrade unless otherwise indicated.

EXAMPLE 1

A Master coating solution was prepared having the following composition:

| Master 1 Composition | |
|---|---|
| Ingredient | Amount |
| Trimethylolpropane ethoxylated triacrylate MW 400 ± 50* | 401.7 |

| -continued | |
|---|---|
| Benzophenone | 52.05 |
| Ethyl Michler's ketone | 1.95 |
| 4-Methyl-4-trichloromethyl cyclohexadiene-1-one | 1.30 |
| 5-Chlorobenzotriazole | 2.60 |
| Victoria Green Dye (C.I. 42000) | 0.52 |
| Victoria Blue Dye (C.I. 42595) | 0.39 |
| P Toluene sulfonic acid | 0.65 |
| HFS** | 50.1 |
| Santicizer ® 9 (mixed o and p toluene sulfonamide) | 55.69 |
| Tris-(4-diethylamino-2-tolyl) methane | 1.95 |
| Leuco Crystal Violet | 3.25 |
| Propylene glycol methyl ether | 142.58 |
| Methylene Chloride | 2274.07 |

*Trimethylolpropane ethoxylated triacrylate (TMPEOTA) has the following ethoxylate distribution which constitutes a minimum of of 92% of the distribution
None  6% Max
Monoethoxy  10–20%
Diethoxy-1  12–18%
Diethoxy-2  14–21%
Triethoxy-1  21–29%
Triethoxy-2  6–10%
Tetraethoxy  12–20%
**HFS is a condensation polymer of hydantoin, formaldehyde and mixed o and p toluene sulfonamide formulated with phthalic anhydride.

In each of 5 samples of 230 g of the Master 1 solution was dissolved 56 grams of each of the following polymeric binders followed by coating the solution on a 0.001 inch thick polyethylene terephthalate support film to give a dry coating thickness of 0.002 inch.

The typical use of each coated resist film is as follows: The dried coated rea dry coating thickness of 0.002 inch.

TABLE I

| Binder | Coating |
|---|---|
| Poly(methylmethacrylate/ethylacrylate), 95.5/4.5, inherent viscosity .52 | A |
| Poly(methylmethacrylate/ethylacrylate), 90.2/9.8, inherent viscosity .44 | B |
| Poly(methylmethacrylate/ethylmethacrylate), 75/25, inherent viscosity 0.49 | C |
| Poly(methylmethacrylate/n-butyl methacrylate, 75/25 inherent viscosity 0.49 | D |
| Poly(methylmethacrylate/i-butyl methacrylate), 75/25, inherent viscosity 0.49 | E |

The typical use of each coated resist film is as follows: The dried coated resist is laminated to a copper clad circuit board substrate which was scrubbed with an abrasive brush using a Riston ® hot roll laminator. The laminated board is imagewise exposed through a $\sqrt{2}$ Stouffer ® 41 stepwedge using a Riston ® PC 24 exposure device and developed in a Riston ® C Processor previously described (at 60° to 70° F..with 20 psi spray pressure) containing stabilized 1,1,1 trichloroethane as the developer solvent.

Samples of each developed board were tested using the following standard plating and etching techniques.

Plate and Etch Procedure:

Each board was immersed for 5 minutes in a 8.5% aqueous solution of Metex ® 9268 preplate cleaner at 130° F. (54.4° C.) rinsed for 1 min in flowing water, immersed in 18% aqueous ammonium persulfate solution for 1 min or less to remove 10–15µ inch copper, rinsed in water again, immersed in 10% sulfuric acid for 1 minute and then immersed in acidic CuSo4 plating solution and plated at 30 amps/sq. ft. (0.333 amps/sq cm) for 36 minutes to produce 0.001 inch (0.0025 cm) plated copper.

The plated board was rinsed in water, immersed for 30 seconds in 20% aqueous fluoroboric acid solution, and then immersed in a commercial tin/lead (60/40) fluoroborate solution (Hi-Thro ®) and plated at 20 amps/sq. ft. (0.166 amps/sq. cm.) for 12 minutes to deposit 0.0005 inch (0.01 mm) solder on the copper plated image.

The board was rinsed with water and then the photopolymerized resist was stripped from the plated board using methylene chloride solvent (SK-900 photoresist stripper).

The stripped board was sprayed at 200 psi with an aqueous ammoniacal copper chloride solution (pH 7.8–8.2) (MacDermid Co. Ultra Etch ® Fine Line) at 130° F. (54.4° C.) to produce a solder plated copper circuit pattern.

Etching Procedure

Each imaged and developed board was sprayed at 20 psi with an etchant solution at 130° F. (54.4° C.) until all unprotected copper was removed. In the instance when an alkaline etchant was used, MacDermid Ultra Etch ® Fine Line was the etchant. In the instance when acid etchant was used, sufficient cupric chloride and hydrochloric acid was used to produce an aqueous solution with a pH about 2.38 and containing 24 ounces of copper/gallon of etchant.

Rate of Development Test Procedure

As described earlier, the standard procedure for measuring development rate is by visually determining the time needed for all unexposed 0.002 inch thick resist to be removed from a laminated panel (i.e., the time to clean) when passed through a processor, Riston ® C processor, at constant conditions, i.e., 4.5 ft/minute transport rate, 65° F. with 20 psi spray pressure of methyl chloroform. From the "time to clean" (TTC) a transport rate is calculated to provide a "break point" at 26 inches into the 72 inch processor development path. The adjusted transport rate is identified as the development rate (DR).

A more acurate method is to first make a composite film resist sample by sequentially laminating 4 layers of the same resist film on top of each other to a copper substratosite film resist sample by sequentially laminating 4 layers of the same resist film on top of each other to a copper substrate. A 3 inch square sample is cut from the laminate, the cover sheet removed and the sample weighed. A train of the different samples to be tested are attached to a carrier sheet with double sided tape and passed through the Riston ® C Processor so that each sample is developed under identical conditions. The time of the developing cycle is adjusted to insure that at least a thin layer of resist remains on each sample. After drying to remove residual solvent and water, the samples are reweighed and the time to clean of the composite layer is calculated from the weight of the resist removed, the density of the resist and the time spent in the developing solvent.

Using the second procedure the "time to clean" (TTC) and the development rate was obtained for Coatings A through E as well as for two commercially available 2 mil resist films Riston ® Type 1020 and Laminar ® GSI resist films. The "time to clean" in seconds and development rate in ft/min. are given in Table II.

Rate of Stripping Test Procedure

As described earlier, the standard procedure for measuring stripping rate is by visually determining the time needed for all exposed 0.002 inch thick resist to be removed from a processed panel (i.e., the time to strip) when passed through a Riston ® C2 processor, previously described, i.e., 10 ft/min. transport rate, 65° F. with 21 psi spray pressure of a solution containing 93% methylene chloride and 6% methanol. From the "time to strip" (TTS) a transport rate is calculated to provide a "break point" at 17 inches into the 72 inch stripper transport path. The adjusted transport rate is identified as the stripping rate (SR). Using this procedure, the time to strip and stripping rate for coatings A through F as well as for two commercially available 2 mil Riston ® Type 1020 and Laminar ® GSI resist films. The time to strip (TTS) in seconds and the stripping rate (SR) in ft/min. are given in Table II.

Creep Viscosity Test Procedure

Samples were tested for creep viscosity (CV) using the procedures originated by Diens and Klemm published in the Journal of Applied Physics, Vol. 17 pages 458 to 471, 1946 on a Du Pont Thermal Mechanical Analyzer attached to a 1090 console. Creep Viscosity (CV) in megapoise for the coatings A-E are given in Table II.

TABLE II

| Coating | TTC | DR | TTS | SR | CV |
|---|---|---|---|---|---|
| A | 28.7 | 4.5 | 9.9 | 8.6 | 460 |
| B | 21.0 | 6.2 | 8.9 | 9.5 | 45 |
| C* | 22.4 | 5.8 | 8.2 | 10.5 | 370 |
| D | 18.9 | 6.9 | 7.1 | 12.0 | 160 |
| E | 19.8 | 6.6 | 6.6 | 12.9 | 320 |
| Riston ® 1020 | 33.0 | 3.9 | 14 | 6.1 | 553 |
| Laminar ® GSI | 35.4 | 3.7 | 10 | 8.5 | 615 |

*Coatings C, I and M have the same formulation and values given for TTC, DR, TTS, and SR are average values for the three sets of measurements.

The development and stripping rate for Coatings B, C, D, and E are well above those for Coating A, Riston ® 1020, and (2 mils thick) Laminar ® GSI indicating the improved throughput for the composition. However, only Coating B has a creep viscosity well below 80 megapoise. Consequently, only Coatings C, D, and E demonstrate the improved throughput along with the expected storage stability required.

EXAMPLE 2

Binders useful in this invention are distinguished by their solubility in 1,1,1 trichloroethane and their specific glass transistion temperature (TG).

The common developer solvent used for commercial solvent photoresist formulations 1,1,1 trichloroethane. Yet the common binder components of these photoresists are insoluble in this solvent. For the purpose of this invention solubility is defined by placing a 0.5 g particulate sample of the polymer binder in 50 g of 1,1,1 trichloroethane at room temperature (e.g., 22° C.) and stirred for 20 hours. The particle size of the binder samples to be used in this test is sufficiently small so that 99.9 wt % of the particles have a diameter less than 425 μM. Solubility is given as the time required for the polymer to dissolve by the disappearance of the particles. Insolubility is defined as the presence of polymer particles after 24 hours stirring.

Table III contains the "time to dissolve" (TTD) hours in 1,1,1 trichloroethane for polymeric binders along with the glass transition temperature which are conventionally determined.

TABLE III

| Binder* | TTD (Hours) | TG (°C.) |
|---|---|---|
| P(EMA) | 0.5 | 65 |
| P(MMA/EMA) (50/50) | 1.5 to 2.5 | 84 |
| P(MMA/EMA) (60/40) | 1.5 to 2.5 | 88 |
| P(MMA/EMA) (75/25) | ≈20 hours | 94 |
| P(MMA/EMA) (85/15) | ≈20 hours | 98 |
| P(MMA/EMA) (90/10) | ≈20 hours | 101 |
| P(MMA/EMA) (96/4) | not soluble | 103 |
| P(MMA/nBMA) (75/25) | 1-3 hours | 80 |
| P(MMA/iBMA) (75/25) | 3-5 hours | 91 |
| P(MMA/EA) 87/13) | ≈20 hours | 82 |
| P(MMA/EA) (90.2/9.8) | ≈20 hours | 87 |
| P(MMA/EA) (95.5/4.5) | not soluble | 97 |
| P(MMA) | not soluble | 105 |

*In this table P is poly; MMA is methylmethacrylate; EMA is ethylmethacrylate; nBMA is nbutyl methacrylate; i-BMA is isobutylmethacrylate; and EA is ethylacrylate.

EXAMPLE 3

A Master 2 Coating solution was prepared having the same composition as Master 1 coating solution but without 401.7 parts by weight of trimethylolpropane ethoxylated triacrylate.

In each of 4 samples of 199.1 g of the Master 2 solution was dissolved complimentary amounts of Poly(methyl methacrylate/ethyl methacrylate, 75/25 P(MMA/EMA) and trimethylolpropane ethoxylated triacrylate (TMPEOTA) as designated in Table IV and then coated and tested as in Example 1. The test results are likewise presented in Table IV.

TABLE IV

| | Monomer: Binder Ratio Variation | | | | |
|---|---|---|---|---|---|
| Coating # | P(MMA/EMA) % Amount | TMPEOTA % Amount | C.V. | TTC | DR |
| F | 48 | 38.9 | 34 | 17.1 | 7.6 |
| G | 50 | 36.9 | 60 | 18.7 | 7 |
| H | 53 | 33.9 | 158 | 20.3 | 6.4 |
| I* | 56 | 30.9 | 316 | 22.4 | 5.8 |

*Coatings C, I and M have the same formulation and values given for TTC, DR, TTS, and SR are average values for the three sets of measurements.

The results demonstrate the effect of increased monomer concentration relative to a particular binder of this invention P (MMA/EMA) 75/25. As monomer concentration increases development rate likewise increases along with throughput. But as monomer concentration approaches 40% by weight of the composition storage stability as measured by creep viscosity drops to unacceptably low levels.

EXAMPLE 4

In each of 7 samples of 230 g of Master 1 solution was dissolved 56 grams of each of the following poly(methyl methacrylate/ethyl methacrylate) binders which differ in the ratio of MMA:EMA. The resulting solutions were coated and tested as in Examples 1 and 2 and the results are given in Table V.

TABLE V

MMA:EMA Ratio Variations

| Coating # | MMA/EMA ratio | iV | TG °C. | TTD (Hours) | CV (MP) | TTC sec | DR ft/min. | TTS sec | SR ft/min. |
|---|---|---|---|---|---|---|---|---|---|
| J | 0/100 | 0.54 | 65 | 0.5 | 34 | 14.8 | 8.8 | 6.8 | 12.5 |
| K | 50/50 | 0.50 | 84 | 2 ± .5 | 271 | 19.8 | 6.6 | 5.7 | 14.9 |
| L | 60/40 | 0.46 | 88 | 2 ± .5 | 310 | 19.5 | 6.7 | 6.5 | 13.1 |
| M* | 75/25 | 0.49 | 94 | 20 | 416 | 22.4 | 5.8 | 8.2 | 10.5 |
| N | 85/15 | 0.50 | 98 | 20 | 475 | 23.7 | 5.5 | 8.0 | 10.6 |
| O | 90/10 | 0.52 | 101 | 20 | 699 | 25.7 | 5.1 | 9.2 | 9.2 |
| P | 96/4 | 0.52 | 103 | NS | 866 | 27.2 | 4.8 | 10.2 | 8.3 |

*Coatings C, I and M have the same formulation and values given for TTC, DR, TTS, and SR are average values for the three sets of measurements.
NS = Not Soluble From the data of Table V it is clear that monomer ratio in the copolymer which are useful in this invention vary from 50/50 to 90/10. The 100% polyethylmethacrylate (#J) would be expected to have poor storage stability compared to the conventional films. The copolymer having 96/4 (#P) ratio not only has the highest time to clear, it also has a very high creep viscosity which adversely affects lamination to the circuit board.

What is claimed is:

1. A solvent developable photopolymerizable composition present as a film with a creep viscosity of at least 20 megapoise comprising
   (a) at least one nongaseous ethylenically unsaturated compound having a boiling point above 100° C. at normal atmospheric pressure and being capable of forming a high polymer by photoinitiated addition polymerization,
   (b) an initiating system activated by actinic radiation, and
   (c) a preformed macromolecular binder soluble in methyl chloroform at a temperature of 22° C. and a time not greater than 24 hours, said binder formed from monomers comprising methylmethacrylate, and $C_2$ to $C_4$ alkyl methacrylate. wherein said composition as a film of 0.002 inch thickness laminated to a copper substrate and imagewise exposed to actinic radiation will meet both of the following conditions:
   (i) a time to clear of not greater than 26 seconds when the imagewise exposed film is passed at a transport speed of 4.5 feet per minute through a spray of methyl chloroform at a temperature of 65° C. and spray pressure of 20 psi (gauge) whereby all unexposed composition is removed from the substrate and
   (ii) a time to strip of the exposed composition of not greater than 9.5 seconds when the exposed composition is passed at a transport speed of 10 feet per minute through a spray of a solution containing by weight 93 parts methylene chloride and 6 parts methanol at a temperature of 65° C. and a spray pressure of 21 psi (gauge) whereby all exposed composition is removed from the substrate.

2. The composition of claim 1 wherein by weight said compound is present in a range from 10 to 40 parts and said binder is present in a range from 40 to 70 parts.

3. The composition of claim 2 wherein compound is present in a range from 28 to 36 parts.

4. The composition of claim 1 wherein the binder will dissolve in methyl chloroform within 20 hours.

5. The composition of claim 1 wherein the binder is formed from methylmethacrylate and ethyl methacrylate.

6. The composition of claim 5 wherein ratio of methyl methacrylate to ethyl methacrylate is at a weight ratio in the range from 90:10 to 50:50.

7. The composition of claim 6 wherein the ratio is from 85:15 to 60:40.

8. The composition of claim 1 which has a creep viscosity of at least 80 megapoise.

9. The composition of claim 1 wherein said compound contains at least one terminal ethylenic group.

10. The composition of claim 1 wherein the binder has a glass transition temperature in a range from 75° C. to 101° C.

11. An article present as a wound roll comprising a support film and a cover film which contains between these two films a solvent developable photopolymerizable composition present as a film with a creep viscosity of at least 20 megapoise comprising
   (a) at least one nongaseous ethylenically unsaturated compound having a boiling point above 100° C. at normal atmospheric pressure and being capable of forming a high polymer by photoinitiated addition polymerization,
   (b) an initiating system activated by actinic radiation, and
   (c) a preformed macromolecular binder soluble in methyl chloroform at a temperature of 22° C. and a time not greater than 24 hours. said binder formed from monomers comprising methylmethacrylate and $C_2$ to $C_4$ alkyl methacrylate, wherein said composition as a film of 0.002 inch thickness laminated to a copper substrate and imagewise exposed to actinic radiation will meet both of the following conditions:
   (i) a time to clear of not greater than 26 seconds when the imagewise exposed film is passed at a transport speed of 4.5 feet per minute through a spray of methyl chloroform at a temperature of 65° C. and spray pressure of 20 psi (gauge) whereby all unexposed composition is removed from the substrate and
   (ii) a time to strip of the exposed composition of not greater than 9.5 seconds when the exposed composition is passed at a transport speed of 10 feet per minute through a spray of a solution containing by weight 93 parts methylene chloride and 6 parts methanol at a temperature of 65° C. and a spray pressure of 21 psi (gauge) whereby all exposed composition is removed from the substrate 12. The article of claim 11 being storage stable at one month at a temperature of 40° C. with a substantial absence of edge fusion.

13. An article present as a would roll comprising a support film and a cover film which contains between these two films a solvent developable photopolymerizable composition present as a film with a creep viscosity of at least 20 megapoise comprising
   (a) at least one nongaseous ethylenically unsaturated compound having a boiling point above 100° C. at normal atmospheric pressure and being capable of forming a high polymer by photoinitiated addition polymerization,
   (b) an initiating system activated by actinic radiation, and
   (c) a preformed macromolecular binder soluble in methyl chloroform at a temperature of 22° C. and a time not greater than 24 hours, said binder formed from monomers comprising methylmethacrylate and $C_2$ to $C_4$ alkyl methacrylate, wherein said composition as a film of 0.002 inch thickness laminated to a copper substrate and imagewise exposed to actinic radiation will meet both of the following conditions;
      (i) a development rate of not less than five feet per minute when the imagewise exposed film is passed through 26 inches of a spray of methyl chloroform at a temperature of 65° C. and spray pressure of 20 psi (gauge) whereby the unexposed resist visually appears to be removed from the substrate and
      (ii) a stripping rate of not less than 9 feet per minute when the exposed composition is passed through 17 inches of a spray of a solution containing by weight 93 parts methylene chloride and 6 parts methanol at a temperature of 65° C. and a spray pressure of 21 psi (gauge) whereby the exposed resist visually appears to be removed from the substrate.

14. A solvent developable photopolymerizable composition precent as a film with a creek viscosity of at least 20 megapoise comprising
   (a) at least one nongaseous ethylenically unsaturated compound having a boiling point above 100° C. at normal atmospheric pressure and being capable of forming a high polymer by photoinitiated addition polymerization,
   (b) an initiating system activated by actinic radiation, and
   (c) a preformed macromolecular binder soluble in methyl chloroform at a temperature of 22° C. and a time not greater than 24 hours, said binder formed from monomers comprising methylmethacrylate and $C_2$ to $C_4$ alkyl methacrylate, wherein said composition as a film of 0.002 inch thickness laminated to a copper substrate and imagewise exposed to actinic radiation will meet both of the following conditions:
      (i) a development rate of not less than five feet per minute when the imagewise exposed film is passed through 26 inches of a spray of methyl chloroform at a temperature of 65° C. and spray pressure of 20 psi (gauge) whereby the unexposed resist visually appears to be removed from the substrate. and
      (ii) a stripping rate of not less than 9 feet per minute when the exposed composition is passed through 17 inches of a spray of a solution containing by weight 93 parts methylene chloride and 6 parts methanol at a temperature of 65° C. and a spray pressure of 21 psi (gauge) whereby the exposed resist visually appears to be removed from the substrate.

* * * * *

UNITED STATES PATENT AND TRADEMARK OFFICE
CERTIFICATE OF CORRECTION

PATENT NO. : 4,716,093

DATED : December 29, 1987

INVENTOR(S) : Richard J. Kempf

It is certified that error appears in the above-identified patent and that said Letters Patent is hereby corrected as shown below:

Column 15, line 4, the word "would" should read -- wound --.

Signed and Sealed this

Twenty-first Day of June, 1988

*Attest:*

DONALD J. QUIGG

*Attesting Officer*  *Commissioner of Patents and Trademarks*

UNITED STATES PATENT AND TRADEMARK OFFICE
CERTIFICATE OF CORRECTION

PATENT NO. : 4,716,093
DATED : December 29, 1987        Page 1 of 2
INVENTOR(S) : Richard J. Kempf It is certified that error appears in the above-identified patent and that said Letters Patent is hereby corrected as shown below:

In column 2, line 3 change "65°C" to --65°F--.

In column 2, line 11 change "65°C" to --65°F--.

In column 2, line 61 "(H 1/8 Vv8804)" should read --(H 1/8 VV8004)-

In column 3, line 29 after "and" insert --a--.

In column 5, line 36 "would" should be --wound--.

In column 7, line 19 after "benzanthraquinone," insert --2,3-benzanthraquinone, 2-methyl-1,4-naphthoquinone--.

In column 8, line 20 "2,6-di-tert-butyl-p-cregol" should be --2,6-di-tert-butyl-p-cresol--.

In column 8, line 35 "would" should be --wound--.

In column 10, lines 46-48 delete "substratosite film resist sample by sequentially laminating 4 layers of the same resist film on top of each other to a copper".

In claim 1, line 12 from the end of the claim change "65°C to --65°F--.

In claim 1, line 4 from the end of the claim change "65°C" to --65°F--.

In claim 11, line 12 from the end of the claim change "65°C" to --65°F--.

In claim 11, line 4 from the end of the claim change "65°C" to --65°F--.

UNITED STATES PATENT AND TRADEMARK OFFICE
CERTIFICATE OF CORRECTION

PATENT NO. : 4,716,093
DATED : December 29, 1987
INVENTOR(S) : Richard J. Kempf

It is certified that error appears in the above—identified patent and that said Letters Patent is hereby corrected as shown below:

In claim 13, line 12 from the end of the claim change "65°C" to --65°F--.

In claim 13, line 4 from the end of the claim change "65°C" to --65°F--.

In claim 14, line 2 "precent" should be --present--.

In claim 14, line 9 from the end of the claim after "substrate" delete the period.

In claim 14, line 12 from the end of the claim change "65°C" to --65°F--.

In claim 14, line 4 from the end of the claim change "65°C" to --65°F--.

Signed and Sealed this

Eleventh Day of September, 1990

*Attest:*

HARRY F. MANBECK, JR.

*Attesting Officer*     *Commissioner of Patents and Trademarks*